United States Patent
Sudo (10) Patent No.: US 7,936,617 B2
(45) Date of Patent: May 3, 2011

(54) NONVOLATILE SEMICONDUCTOR MEMORY DEVICE

(75) Inventor: Naoaki Sudo, Yokohama (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 145 days.

(21) Appl. No.: 12/341,632

(22) Filed: Dec. 22, 2008

(65) Prior Publication Data

US 2009/0190395 A1    Jul. 30, 2009

(30) Foreign Application Priority Data

Dec. 26, 2007  (JP) ................................ 2007-334106
Dec. 18, 2008  (KR) ................................ 2008-129556

(51) Int. Cl.
*G11C 5/14*    (2006.01)
(52) U.S. Cl. ......... 365/189.09; 365/189.16; 365/189.11; 365/185.2; 365/185.23; 365/185.18; 365/185.03
(58) Field of Classification Search ............. 365/189.09, 365/189.16, 189.11, 185.02, 185.23, 185.18, 365/185.03
See application file for complete search history.

(56) References Cited

U.S. PATENT DOCUMENTS

| | | | |
|---|---|---|---|
| 5,495,442 A * | 2/1996 | Cernea et al. | 365/185.03 |
| 5,982,163 A * | 11/1999 | Shinozaki | 323/354 |
| 6,003,148 A * | 12/1999 | Yamauchi et al. | 714/711 |
| 6,373,780 B1 * | 4/2002 | Micheloni et al. | 365/230.06 |
| 6,754,107 B2 * | 6/2004 | Khouri et al. | 365/185.23 |
| 6,801,025 B2 * | 10/2004 | Carballo et al. | 323/234 |
| 6,822,905 B2 * | 11/2004 | Micheloni et al. | 365/185.21 |
| 6,922,360 B2 * | 7/2005 | Ryoo | 365/185.18 |
| 6,980,473 B1 * | 12/2005 | Bautista et al. | 365/189.16 |
| 7,139,197 B2 * | 11/2006 | Martines et al. | 365/185.21 |
| 7,274,599 B2 * | 9/2007 | Lee | 365/185.22 |
| 7,376,023 B2 * | 5/2008 | Umezawa | 365/189.09 |

FOREIGN PATENT DOCUMENTS

JP    2006-294217    10/2006

* cited by examiner

*Primary Examiner* — Viet Q Nguyen
(74) *Attorney, Agent, or Firm* — Myers Bigel Sibley & Sajovec, P.A.

(57) ABSTRACT

Provided is a nonvolatile semiconductor memory device which can enhance a stable control of a voltage applied to a memory cell and has excellent capability of controlling a drain voltage. The nonvolatile semiconductor memory device includes: a plurality of memory cells; a write buffer receiving data to be written to the plurality of memory cells; a count circuit searching data input to the write buffer and determining bit number of data to be simultaneously programmed to the plurality of memory cells; a write circuit supplying a write voltage to the plurality of memory cells according to the data; and a voltage regulator supplying a control voltage (Vpb) to the write circuit, wherein the voltage regulator includes a controller Counting write bit number and supplying the control voltage (Vpb) according to the counted write bit number.

6 Claims, 8 Drawing Sheets

NONVOLATILE SEMICONDUCTOR MEMORY DEVICE

CROSS-REFERENCE TO RELATED APPLICATIONS

This U.S. non-provisional patent application claims priority under 35 U.S.C. §119 of Japanese Patent Application No. 2007-334106, filed on Dec. 26, 2007 and Korea Patent Application No. 2008-129556 filed on Dec. 18, 2008, the entire contents of which are hereby incorporated by reference.

BACKGROUND OF THE INVENTION

The present invention disclosed herein relates to a nonvolatile semiconductor memory device, and more particularly, to a flash memory device including a voltage regulator supplying a reference voltage.

Semiconductor memory devices are storage devices that store data and read the stored data when necessary. Semiconductor memory devices are categorized into random access memory (RAM) as a volatile memory device and read only memory (ROM) as a nonvolatile memory device. Examples of RAM include a dynamic RAM (DRAM) and a static RAM (SRAM), and examples of ROM include a flash memory device, a programmable ROM (PROM), an erasable PROM (EPROM), and an electrically EPROM (EEPROM).

Flash memory devices are a type of ROM. Since the flash memory devices have low power consumption and can read and write data freely, they are suitable for digital cameras, mobile phones, personal digital assistants (PDAs), and so on. In addition, flash memory devices are categorized into NAND flash memory devices and NOR flash memory devices according to the structure of a memory cell array. The NAND flash memory devices are memory devices for data storage and are mainly used in USB storage devices or MP3 players. Meanwhile, the NOR flash memory devices are memory devices for code storage and are used in mobile phone terminals requiring high-speed data processing because of their fast processing speed.

Recent NOR flash memory devices can store multi-bit data in one memory cell. Such NOR flash memory devices execute a program operation based on an incremental step pulse program (ISPP), and use a bit scan method for increasing a program speed.

The bit scan method is a method which searches data "0" in input data and simultaneously programs the searched data "0" on the basis of predetermined bit number. The bit scan method can increase the program speed and reduce the program time.

As one of known technical documents, there is Japanese Patent Publication No. 2006-294217.

Figure 6:
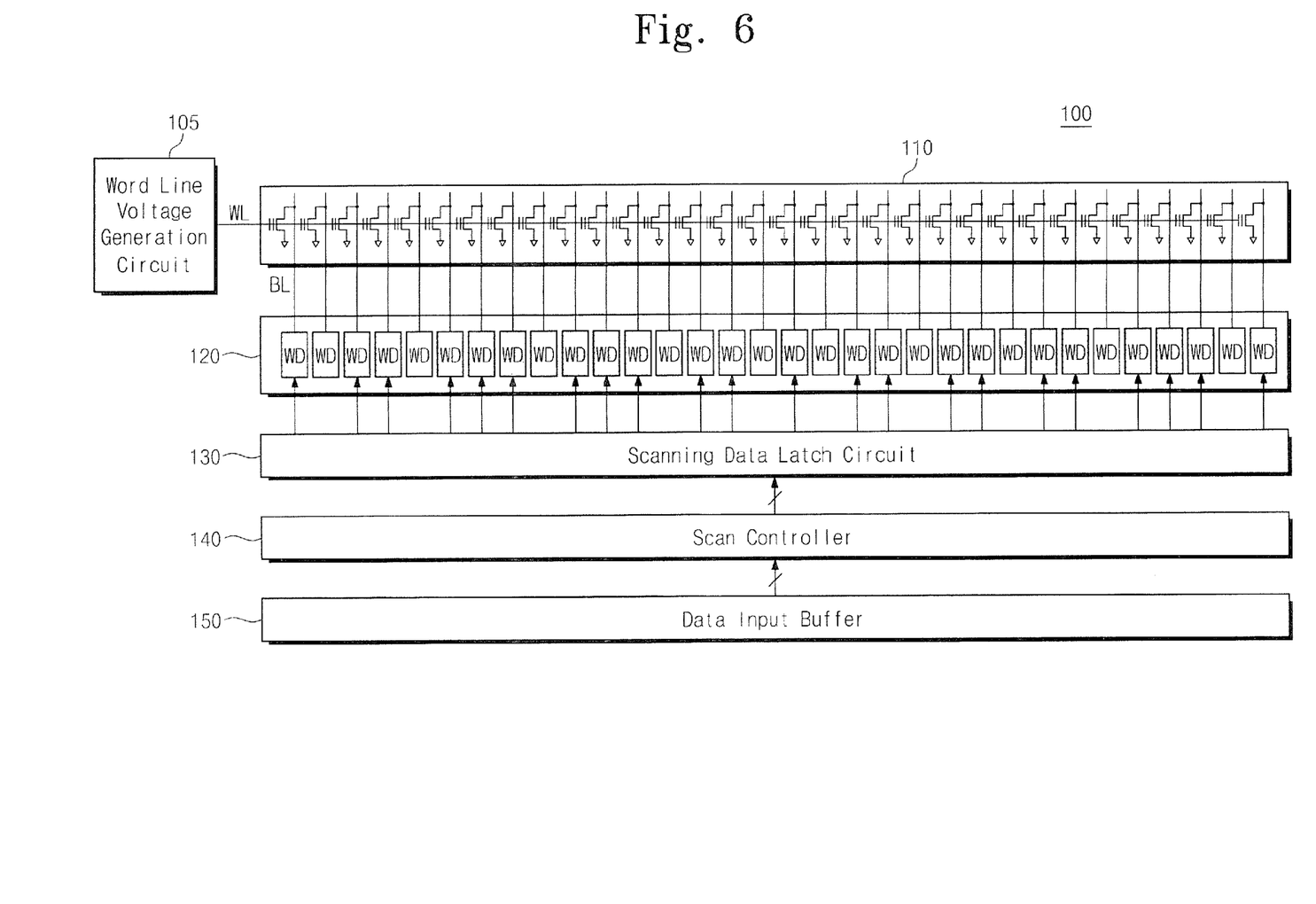
FIG. 6 illustrates a NOR flash memory device disclosed in a patent document, which was filed by the present applicant.

FIG. 6 illustrates a NOR flash memory device disclosed in Japanese Patent Publication No. 2006-294217. Referring to FIG. 6, the NOR flash memory device 100 includes a plurality of memory cells 110, a word line voltage generation circuit 105, a data input buffer 150, a scan controller 140, a scanning data latch circuit 130, and a write driver circuit 120. Upon program operation, the word line voltage generation circuit 105 generates a step voltage to a word line WL commonly connected to the plurality of memory cells 110. The step voltage refers to a stepwise increasing voltage. Data to be written to the plurality of memory cells 110 are input to the data input buffer 150. The scan controller 140 searches data input to the data input buffer 150 and determines bit number of data to be simultaneously programmed to the plurality of memory cells. The scanning data latch circuit 130 latches the data searched by the scan controller 140. The write driver circuit 120 provides a write voltage to bit lines BL of the memory cells 110 according to the data latched in the scanning data latch circuit 130. Whenever the step voltage is supplied to the word line WL, the scan controller 140 can vary the bit number of the data to be simultaneously programmed, and can constantly control the number of memory cells to which a write operation is performed.

Figure 3:
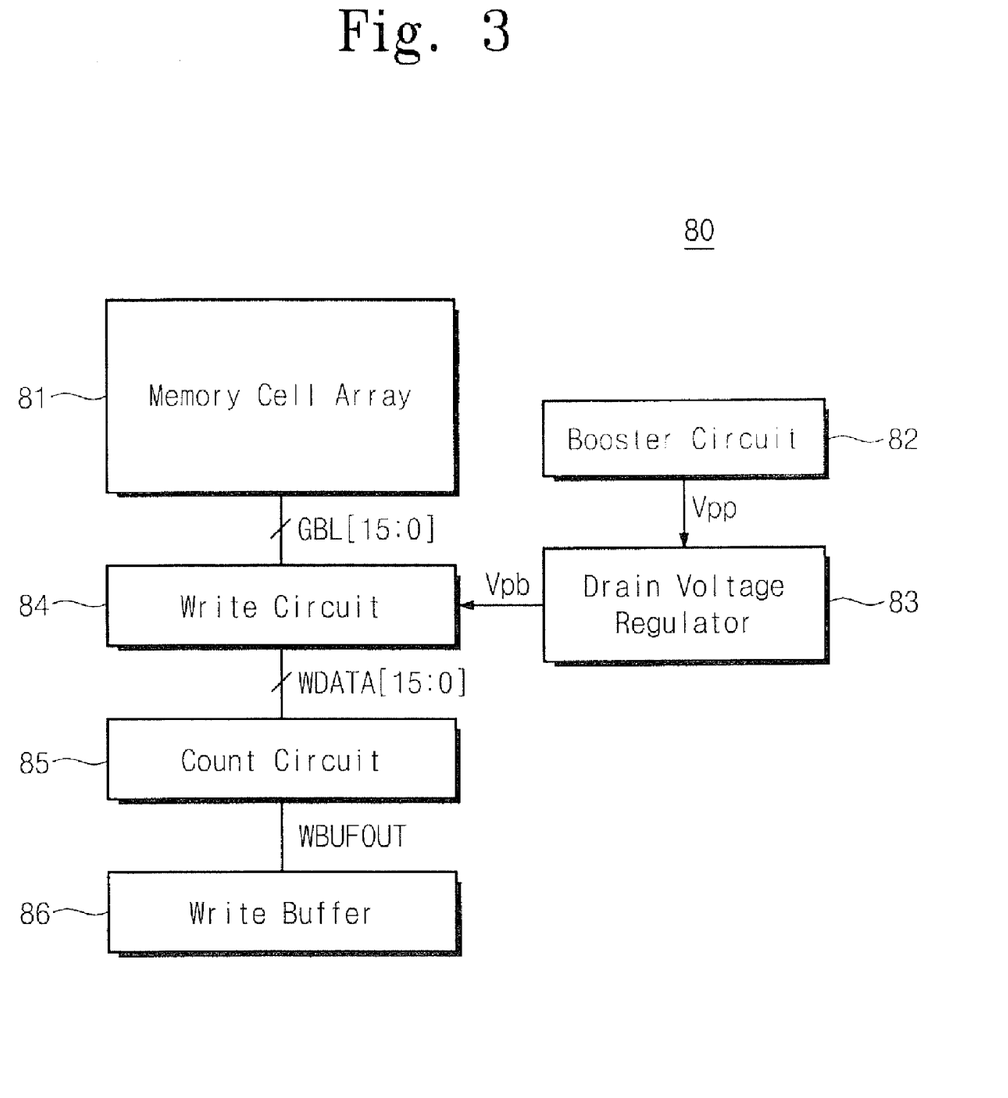
FIG. 3 is a schematic block diagram of a typical NOR flash memory device including a drain voltage regulator.
Figure 4:
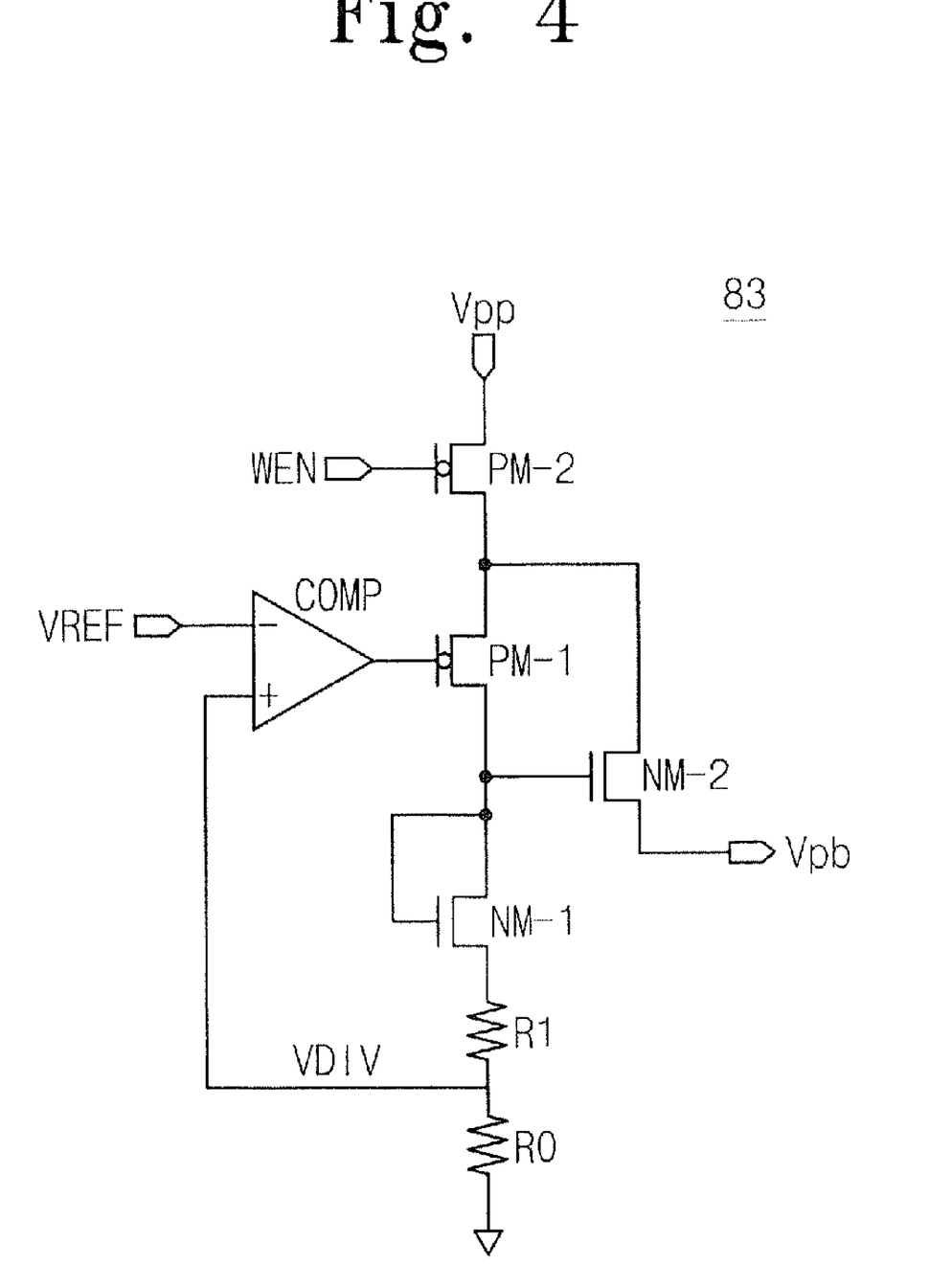
FIG. 4 is a circuit diagram of the drain voltage regulator in the typical NOR flash memory device.
Figure 5:
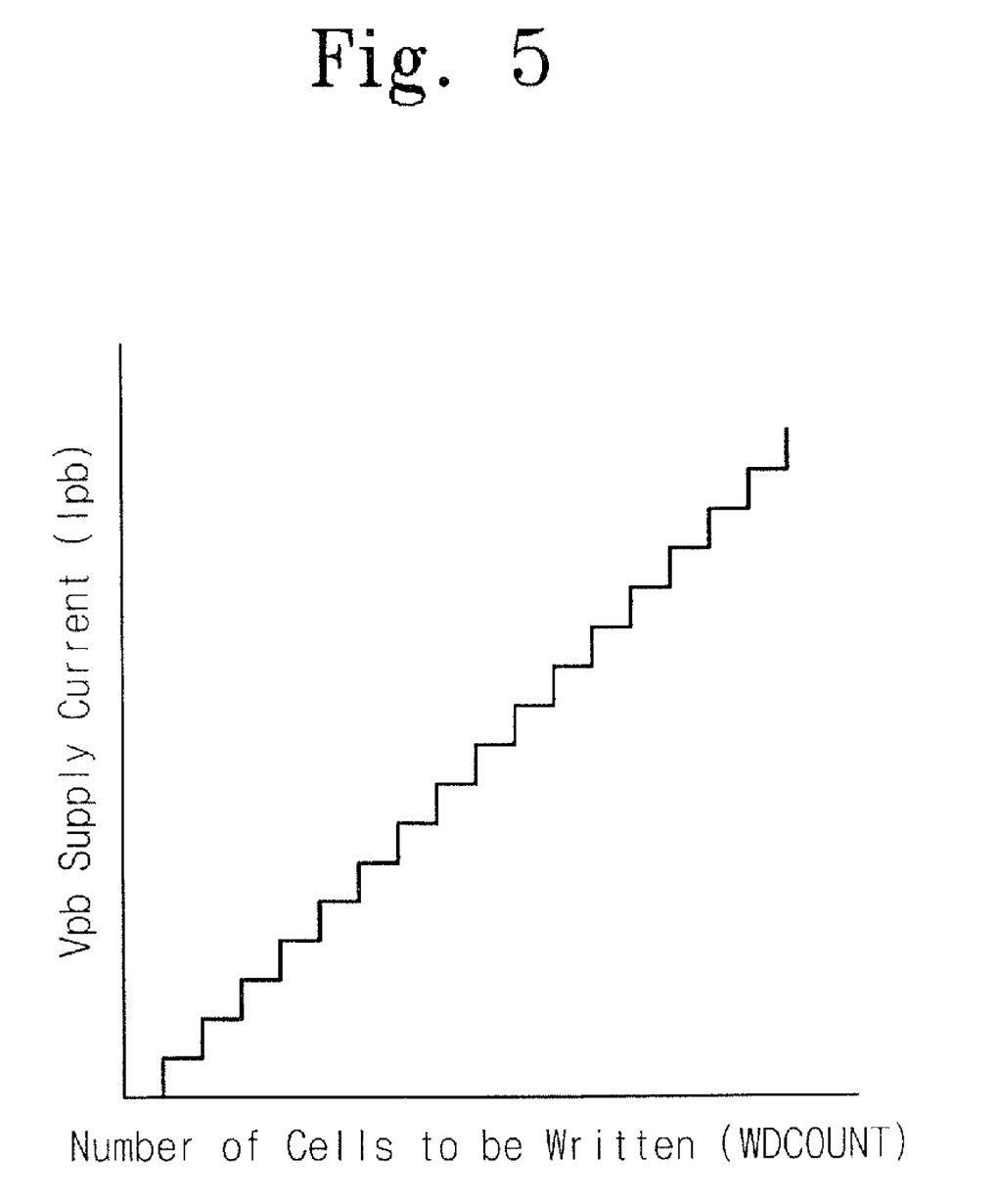
FIG. 5 is a graph illustrating the relation between "a current (Ipb) supplied by a voltage (Vpb)" and "number of cells to be written (WDCOUNT: an output signal of a counter circuit)" in the typical NOR flash memory device.

FIGS. 3 through 5 illustrate a typical NOR flash memory device. Specifically, FIG. 3 is a schematic block diagram of a typical NOR flash memory device 80 including a drain voltage regulator 8, and FIG. 4 is a circuit diagram of the drain voltage regulator 83. FIG. 5 is a graph illustrating the relation between "a current (Ipb) supplied by a voltage (Vpb)" and "number of cells to be written (WDCOUNT: an output signal of a counter circuit)".

The memory device 80 of FIG. 3 includes a memory cell array 81 in which rows (word lines WL0 to WLi) and columns (bit lines BL0 to BLj) are arranged in a matrix form. A write circuit 84, a count circuit 85, and a write buffer 86 are serially connected to the memory cell array 81.

In addition, a booster circuit 82 and a drain voltage regulator 83 are serially connected to the write circuit 84. The drain voltage regulator 83 regulates a high voltage Vpp generated by the booster circuit 82 to a required voltage Vpb and supplies the regulated voltage to the write circuit 84.

FIG. 4 is a circuit diagram of the drain voltage generator 83. The drain voltage regulator 83 includes a comparator COMP, a PMOS transistor PM-1 resistors R1 and R0 used as a divider, a PMOS transistor PM-2 receiving a write enable signal WEN, and NMOS transistors NM-1 and NM-2.

The comparator COMP determines whether an output voltage VDIV of the divider is higher or lower than the reference voltage VREF. The PMOS transistor PM-1 operates according to the determination result of the comparator COMP.

In the drain voltage regulator 83 of FIG. 4, the PMOS transistor PM-1 has a gate connected to the comparator COMP, a drain connected to the high voltage Vpp through the PMOS transistor PM-2, and a source grounded through the NMOS transistor NM-1 and the resistors R1 and R0.

The NMOS transistor NM-2 has a gate connected to the source of the PMOS transistor PM-1, a drain connected to the high voltage Vpp through the PMOS transistor PM-2, and a source connected to an output terminal of the voltage Vpb.

Also, the PMOS transistor PM-2 has a gate receiving the write enable signal EN, and a drain connected to the high voltage Vpp.

Also, the NMOS transistor NM-1 has a drain and a gate commonly connected to the source of the PMOS transistor PM-1, and a source grounded through the resistors R1 and R0.

As illustrated in FIG. 4. the typical NOR flash memory device always performs the same operation, regardless of the write bit number.

FIG. 5 is a graph illustrating the relation between "a current (Ipb) supplied by a voltage (Vpb)" and "number of cells to be written (WDCOUNT: an output signal of a counter circuit)" in the typical NOR flash memory device. The bit number is proportional to the current.

In practice, however, the voltage level of the voltage Vpb varies because an amount of current supplied from the voltage Vpb is different according to the write bit number.

For example, if the write bit number is 1 bit and the number of cells to be written simultaneously is 1, Ipb=Icell, where Ipb is a current supplied from the voltage Vpb and Icell is a current flowing through the drain-source path of the memory cell in the write operation.

If the write bit number is 16 bits and the number of cells to be written simultaneously is 16, Ipb=16×Icell, where Ipb is a current supplied from the voltage Vpb and Icell is a current flowing through the drain-source path of the memory cell in the write operation.

In this case, the NMOS transistor controlling the voltage Vpb operates as a resistive element, so that a current supply amount when the write bit number is 1 is larger than that when the write bit number is 16. Thus, the output voltage Vpb is also lowered.

SUMMARY OF THE INVENTION

The present invention provides a semiconductor memory device, which is capable of enhancing a stable control of a voltage applied to a memory cell and has excellent capability of controlling a drain voltage.

Embodiments of the present invention provide nonvolatile semiconductor memory devices, including: a plurality of memory cells; a write buffer receiving data to be written to the plurality of memory cells; a count circuit searching data input to the write buffer and determining bit number of data to be simultaneously programmed to the plurality of memory cells; a write circuit supplying a write voltage to the plurality of memory cells according to the data; and a voltage regulator supplying a control voltage (Vpb) to the write circuit, wherein the voltage regulator includes a controller counting write bit number and supplying the control voltage (Vpb) according to the counted write bit number.

In some embodiments, the voltage regulator receives input signals (WEN), the number of which is determined according to the bit number. The voltage regulator controls the input signals (WEN) in response to an output signal (WDCOUNT) of the count circuit.

In other embodiments of the present invention, nonvolatile semiconductor memory devices include: a plurality of memory cells; a write circuit receiving a control voltage to supply a write voltage to the plurality of memory cells according to data to be programmed; and a voltage regulator varying the control signal supplied to the write circuit according to bit number written to the plurality of memory cells.

In some embodiments, the voltage regulator increases the control voltage supplied to the write circuit as the bit number written to the plurality of memory cells increases. The voltage regulator decreases the control voltage supplied to the write circuit as the bit number written to the plurality of memory cells decreases. The nonvolatile semiconductor memory device further includes: a write buffer receiving data to be written to the plurality of memory cells; and a count circuit determining bit number of data to be simultaneously programmed to the plurality of memory cells by referring to data input to the write buffer. The voltage regulator includes: a voltage receiving node receiving a power supply voltage; an output node outputting the control voltage; and a plurality of switches connected in parallel between the voltage receiving node and the output node, and configured to be selectively enabled according to the bit number written to the plurality of memory cells.

In still other embodiments of the present invention, memory cards include: a nonvolatile memory; and a memory controller configured to control the nonvolatile memory, wherein the nonvolatile memory includes the above-described nonvolatile semiconductor memory device.

In even other embodiments of the present invention, solid state drives include: a nonvolatile memory; and a memory controller configured to control the nonvolatile memory, wherein the nonvolatile memory includes the above-described nonvolatile semiconductor memory device.

BRIEF DESCRIPTION OF THE DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

It should be construed that foregoing general illustrations and following detailed descriptions are exemplified and an additional explanation of claimed inventions is provided. Reference numerals are indicated in detail in preferred embodiments of the present invention, and their examples are represented in reference drawings. In every possible case, like reference numerals are used for referring to the same or similar elements in the description and drawings.

Below, a nonvolatile semiconductor memory device is used as one example for illustrating characteristics and functions of the present invention. However, those skilled in the art can easily understand other advantages and performances of the present invention according to the descriptions. The present invention may be embodied or applied through other embodiments. Besides, the detailed description may be amended or modified according to viewpoints and applications, not being out of the scope, technical idea and other objects of the present invention.

Hereinafter, nonvolatile semiconductor memory devices according to exemplary embodiments of the present invention will be described in detail with reference to FIGS. 1 and 2.

Figure 1:
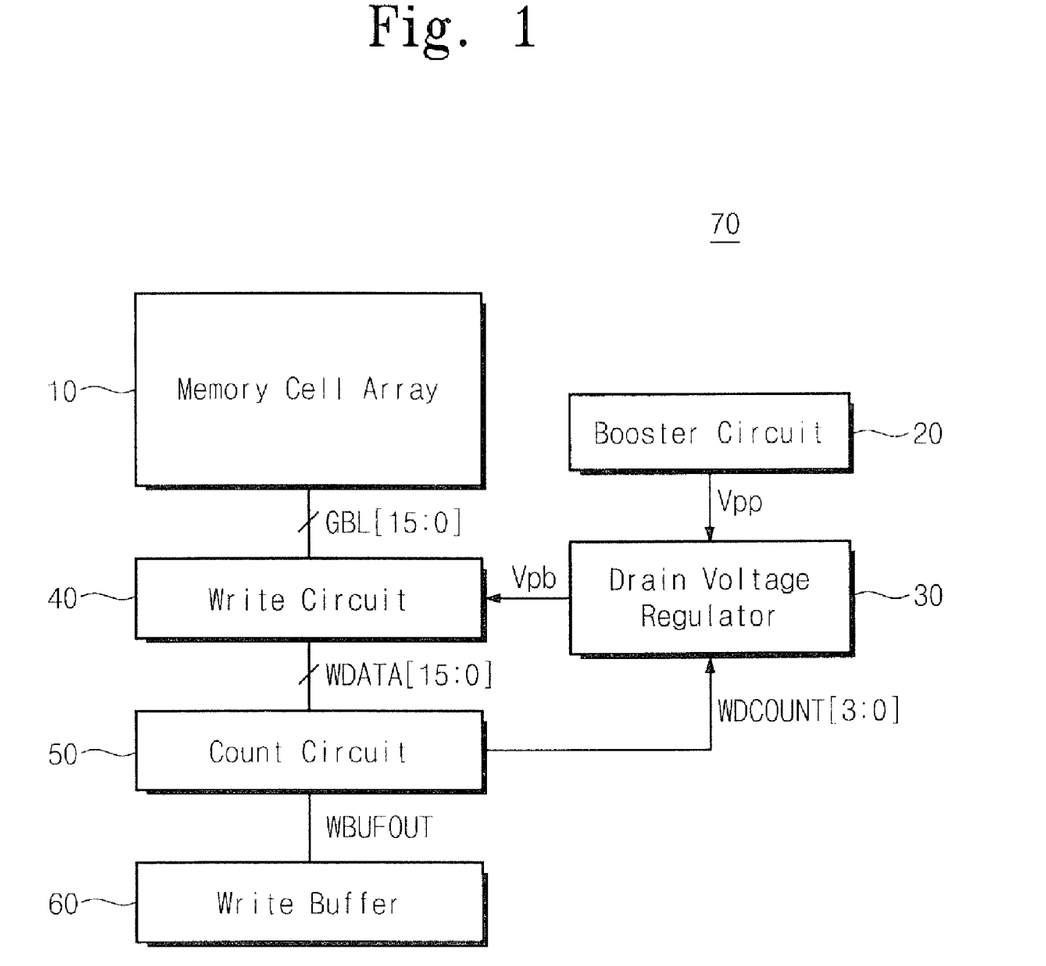
FIG. 1 is a block diagram of a NOR flash memory device including a drain voltage regulator according to a first embodiment of the present invention.
Figure 2:
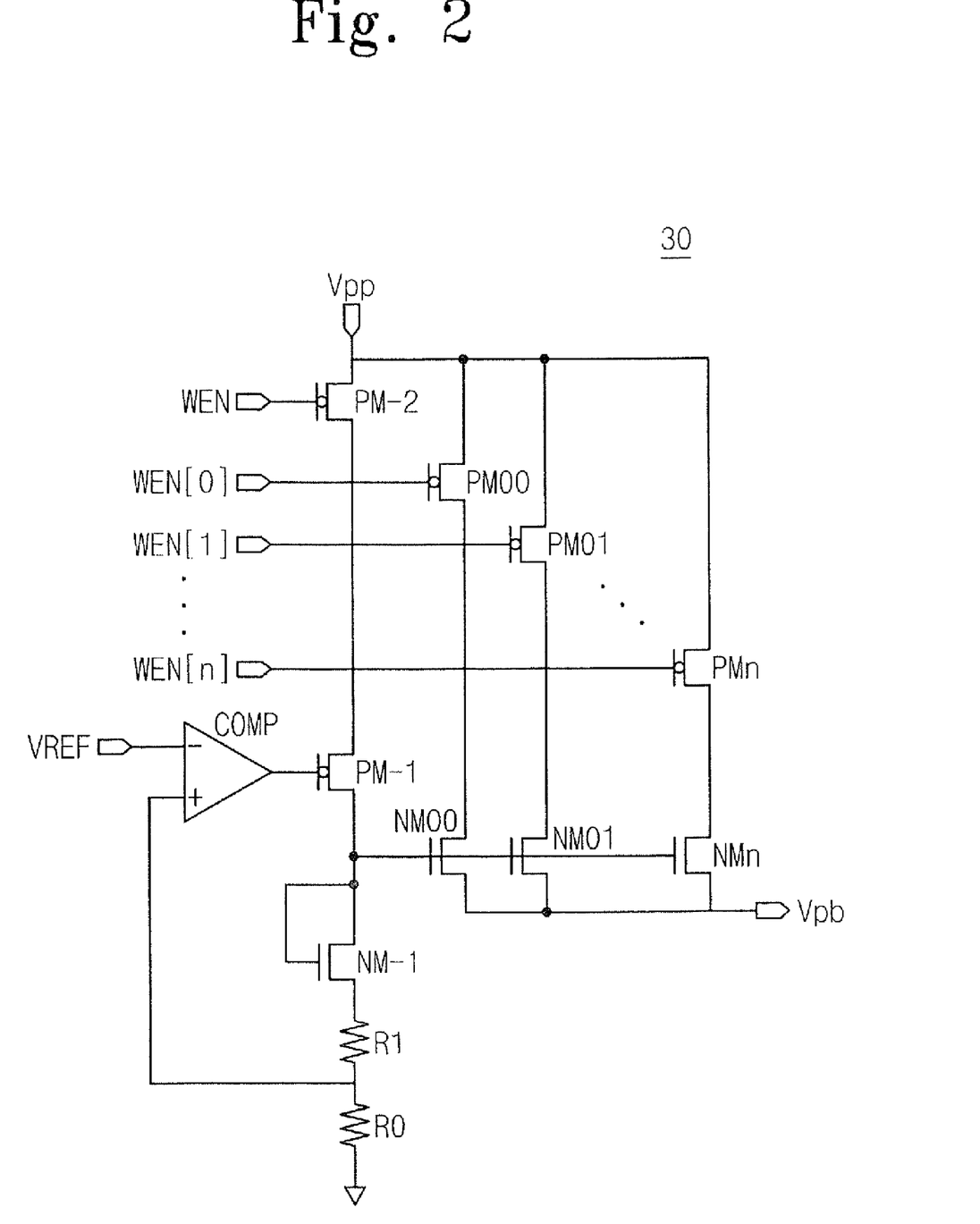
FIG. 2 is a circuit diagram of the drain voltage regulator in the NOR flash memory device according to the embodiment of the present invention.

FIG. 1 is a block diagram of a NOR flash memory device 70 including a drain voltage regulator 30 according to a first embodiment of the present invention, and FIG. 2 is a circuit diagram of the drain voltage regulator 30 in the NOR flash memory device 70.

The flash memory device of FIG. 1 includes a memory cell array 10 in which rows (word lines WL0 to WLi) and columns (bit lines BL0 to BLj) are arranged in a matrix form. A write circuit 40, a count circuit 50, and a write buffer 60 are serially connected to the memory cell array 10.

In addition, a booster circuit 20 and a drain voltage regulator 30 are serially connected to the write circuit 40. The drain voltage regulator 30 regulates a high voltage Vpp generated by the booster circuit 20 to a required voltage Vpb and supplies the regulated voltage to the write circuit 40.

FIG. 2 is a circuit diagram of the drain voltage generator 30 according to an embodiment of the present invention. The drain voltage regulator 30 receives a plurality of input signals (WEN: write enable signals) according to bit number. In addition, the drain voltage regulator 30 also receives an output signal WDCOUNT[3:0] (4 bits) of a count circuit 50. The output signal WDCOUNT[3:0] of the count circuit 50 is decoded and used to control the input signals (WEN: write enable signals).

A difference between the drain voltage regulator 30 of FIG. 2 and the typical drain voltage regulator of FIG. 80 will be described below.

A pair of a PMOS transistor PM00 and an NMOS transistor NM00, a pair of a PMOS transistor PM01 and an NMOS transistor NM01, . . . , a pair of a PMOS transistor PMn and an NMOS transistor NMn are connected in parallel between the voltage (Vpp) terminal and the voltage (Vpb) terminal. The number of the pairs of the PMOS transistor and the NMOS transistor corresponds to the bit number.

Drains of the PMOS transistors PM00 to PMn are commonly connected to one another between a voltage (Vpb) input terminal and the PMOS transistor PM-2. Gates of the PMOS transistors PM00 to PMn receive the input signals (write enable signals) WEN[0] to WEN[n]. Sources of the PMOS transistors PM00 to PMn arc commonly connected to a voltage (Vpb) output terminal through the NMOS transistors NM00 to NMn.

Gates of the NMOS transistors NM00 to NMn are commonly connected between the PMOS transistor PM-1 and the NMOS transistor NM-1, and sources of the NMOS transistors NM00 to NMn are connected to the voltage (Vpb) output terminal.

For example, when the write bit number is 16, NMOS transistors NM00, NM01, NM02, . . . , NM15 connected in parallel for supply of the voltage Vpb are enabled.

In addition, when the write bit number is 1, only the NMOS transistor NM00 among the NMOS transistors connected in parallel for supply of the voltage Vpb is enabled, while the remaining NMOS transistors are disabled.

Each NMOS transistor for supply of the voltage Vpb supplies a constant current (Icell) and can supply a stable voltage Vpb.

The voltage regulator of the nonvolatile semiconductor memory device according to the embodiment of the present invention includes a controller which counts the write bit number and supplies the control voltage Vpb according to the bit number. For example, when the write bit number is 16, it can be considered that the memory cells are divided by 16. Also, the memory cells can also be divided by 8, 4 or 2, even though the control precision is degraded in this order.

Furthermore, the present invention can also be applied to nonvolatile semiconductor memory devices which do not employ the bit scan method.

Figure 7:
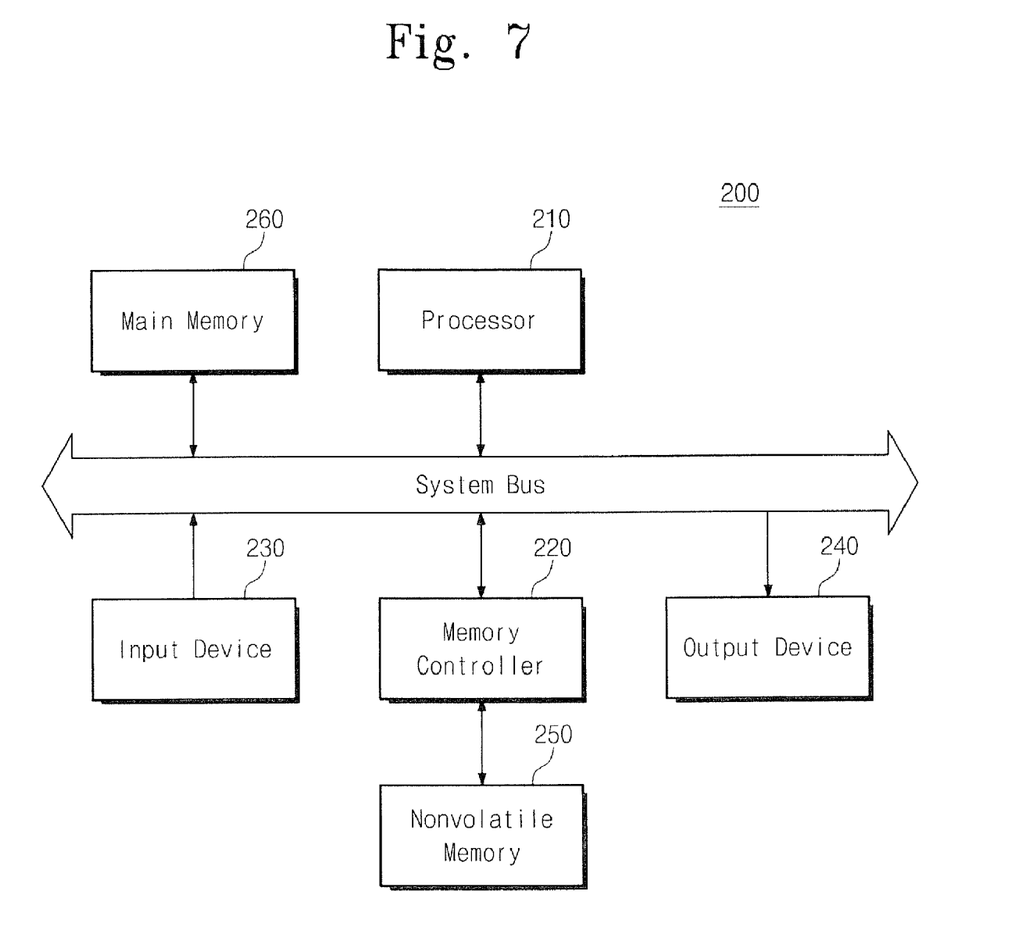
FIG. 7 is a schematic block diagram of a computing system including a nonvolatile semiconductor memory device according to an embodiment of the present invention.

FIG. 7 is a schematic block diagram of a computing system including a nonvolatile semiconductor memory device according to an embodiment of the present invention. Referring to FIG. 7, the computing system 200 includes a processor 210, a memory controller 220, input devices 230, output devices 240, a nonvolatile memory 250, and a main memory 260. In FIG. 7, solid lines represent system buses through which data or commands are transferred.

The memory controller 220 and the nonvolatile memory 250 may constitute a memory card. The processor 210, the input devices 230, the output devices 240, and the main memory 260 may constitute a host using the memory card as a storage device.

The computing system 200 according to the embodiment of the present invention receives external data through the input devices (keyboard, camera, and so on). The input data may be user commands or multimedia data such as image data output from the camera. The input data are stored in the nonvolatile memory 250 or the main memory 260.

The processing result of the processor 210 is stored in the nonvolatile memory 250 or the main memory 260. The output devices 240 output data stored in the nonvolatile memory 250 or the main memory 260.

The output devices 240 output digital data in a format which can be sensed by human. For example, the output devices 240 include a display or a speaker. The nonvolatile memory 250 includes the drain voltage regulator according to the embodiment of the present invention.

The nonvolatile memory 250 and/or the memory controller 220 may be packaged using various types of package. For example, the nonvolatile memory 250 and/or the memory controller 220 may be packaged using packages as follows: Package on Package (PoP), Ball grid arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System in Package (SIP), Multi Chip Package (MCP), Wafer-level Fabricated Package (WFP), or Wafer-Level Processed Stack Package (WSP).

Although not shown, it is obvious to those of ordinary skill in the art that a power supply is required to supply a power supply voltage necessary for the operation of the computing system 200. When the computing system 200 is a mobile device, a battery is additionally required to supply an operating voltage of the computing system 200.

Figure 8:
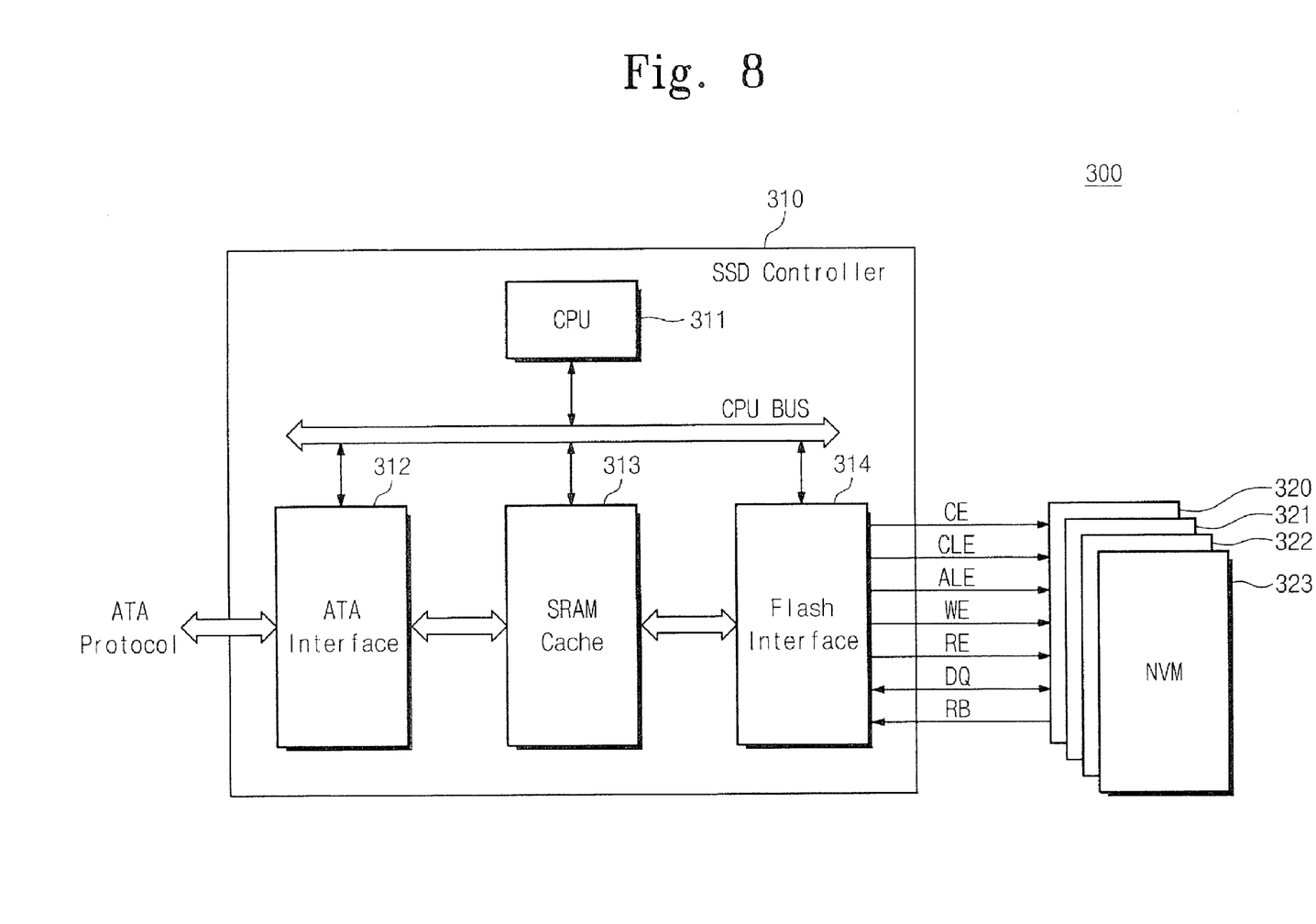
FIG. 8 is a schematic block diagram of a solid state derive (SSD) system according to an embodiment of the present invention.

FIG. 8 is a schematic block diagram of a solid state derive (SSD) system according to an embodiment of the present invention. Referring to FIG. 8, the SSD system 300 includes an SSD controller 310 and flash memories 320 to 323.

The nonvolatile semiconductor memory device according to the embodiments of the present invention can also be applied to a solid state drive (SSD). SSD products expected to replace hard disk drive (HDD) are attracting attention in next-generation memory markets. SSDs are data storage devices that store data by using memory chips such as flash memories, instead of a rotating disk used in typical HDDs. The SSDs have fast speeds and low power consumption and are robust to external impacts, compared with HDDs operating mechanically.

Referring again to FIG. 8, a central processing unit (CPU) 311 receives a command from the host and determines whether to store data from the host in the flash memory or read data stored in the flash memory and transfer the read data to the host. An ATA interface 312 exchanges data with the host side under control of the CPU 311.

The ATA interface 212 includes a serial ATA (S-ATA) standard and a parallel ATA (P-ATA) standard. The ATA interface 312 fetches the command and address from the host side and transfers the fetched command and address to the CPU 311 through CPU buses. Data input from the host through the ATA interface 312 or data to be transferred to the host are transferred through an SRAM cache 213 under control of the CPU 311, without passing through the CPU buses.

The SRAM cache 313 temporarily stores data transferred between the host and the flash memories 320 to 323. In addition, the SRAM cache 313 is used to store programs to be executed by the CPU 311. The SRAM cache 313 may be considered as a kind of a buffer memory, and it need not be configured with the SRAM. The flash interface 314 inputs and outputs data from/to the nonvolatile memories used as the storage devices. The flash interface 314 may be configured to support NAND flash memories, One-NAND flash memories, or multi-level flash memories. The nonvolatile semiconductor memory device according to the embodiment of the present invention can be used as a mobile storage device. Therefore, the nonvolatile semiconductor memory device can be used as storage devices of MP3, digital camera, PDA, e-Book. Furthermore, the nonvolatile semiconductor memory device can be used as a storage device of digital TV or computer.

The nonvolatile semiconductor memory device according to the embodiments of the present invention can control the write cell number in the last one of iterative write operations in a word (16 bits) write operation or a write buffer write operation. Furthermore, the nonvolatile semiconductor memory device can also control the drain voltage regulator such that the drain voltage is constant and AC operation is performed.

The above-disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A nonvolatile semiconductor memory device, comprising:
    a plurality of memory cells;
    a write buffer receiving data to be written to the plurality of memory cells;
    a count circuit searching data input to the write buffer and determining a number of data bits to be simultaneously programmed to the plurality of memory cells and generating an encoded bit count of the number of data bits to be simultaneously programmed;
    a write circuit supplying a write voltage to the plurality of memory cells according to the data; and
    a voltage regulator supplying a control voltage to the write circuit, wherein the voltage regulator comprises a controller decoding the encoded bit count to provide a write bit number corresponding to the number of data bits to be simultaneously programmed and supplying the control voltage according to the write bit number.

2. A nonvolatile semiconductor memory device, comprising:
    a plurality of memory cells;
    a write circuit receiving a control voltage to supply a write voltage to the plurality of memory cells according to data to be programmed;
    a voltage regulator varying the control signal supplied to the write circuit according to a number data bits to be simultaneously programmed to the plurality of memory cells;
    a write buffer receiving data to be written to the plurality of memory cells; and
    a count circuit determining the number of data bits to be simultaneously programmed to the plurality of memory cells by counting data input to the write buffer and generating an encoded bit count of the number of data bits to be simultaneously programmed; wherein the voltage regulator comprises:
    a voltage receiving node receiving a power supply voltage;
    an output node coupling the control voltage to the write circuit; and
    switches connected in parallel with one another between the voltage receiving node and the output node, and configured to be selectively enabled using signals decoded from the encoded bit count, wherein the switches further comprise respective pairs of PMOS and NMOS transistors wherein each of the PMOS transistors includes a drain terminal connected to the voltage receiving node and a source terminal connected to a first terminal of the NMOS transistor included in the respective pair, and a gate terminal connected to a respective one of the signals decoded from the decoded bit count and configured to turn on responsive to activation of the respective signal connected thereto, so that the control voltage to the write circuit is developed at the output node by each of second terminals of the NMOS transistor included in the respective pair.

3. The nonvolatile semiconductor memory device of claim 2, wherein the voltage regulator increases the control voltage supplied to the write circuit as the number of data bits to be simultaneously programmed to the plurality of memory cells increases.

4. The nonvolatile semiconductor memory device of claim 2, wherein the voltage regulator decreases the control voltage supplied to the write circuit as the number of data bits to be simultaneously programmed to the plurality of memory cells decreases.

5. A memory card, comprising:
    a nonvolatile memory; and
    a memory controller configured to control the nonvolatile memory,
    wherein the nonvolatile memory comprises the nonvolatile semiconductor memory device of claim 2.

6. A solid state drive, comprising:
    a nonvolatile memory; and
    a memory controller configured to control the nonvolatile memory,
    wherein the nonvolatile memory comprises the nonvolatile semiconductor memory device of claim 2.

* * * * *